United States Patent
Han

(10) Patent No.: US 7,314,515 B2
(45) Date of Patent: Jan. 1, 2008

(54) APPARATUS FOR FABRICATION OF GAN BULK SINGLE CRYSTAL AND FABRICATION METHOD OF GAN SINGLE CRYSTAL INGOT USING THE SAME

(75) Inventor: Jai-yong Han, Suwon-si (KR)

(73) Assignee: Samsung Corning Co., Ltd., Suwon-Si, Gyeonggi-Do (KR)

( * ) Notice: Subject to any disclaimer, the term of this patent is extended or adjusted under 35 U.S.C. 154(b) by 72 days.

(21) Appl. No.: 11/220,709

(22) Filed: Sep. 8, 2005

(65) Prior Publication Data

US 2006/0169200 A1 Aug. 3, 2006

(30) Foreign Application Priority Data

Jan. 28, 2005 (KR) .................. 10-2005-0007999

(51) Int. Cl.
*C30B 1/00* (2006.01)

(52) U.S. Cl. ................... 117/2; 117/3; 438/479

(58) Field of Classification Search .............. 117/2, 117/3; 438/479
See application file for complete search history.

(56) References Cited

U.S. PATENT DOCUMENTS 6,632,725 B2 10/2003 Trassoudaine et al.

*Primary Examiner*—Felisa Hiteshew
(74) *Attorney, Agent, or Firm*—Buchanan Ingersoll & Rooney PC

(57) ABSTRACT

An apparatus for fabricating a GaN single crystal and a fabrication method for producing GaN single crystal ingot are provided. The apparatus includes: a reactor including a ceiling, a floor and a wall with a predetermined height encompassing an internal space between the ceiling and the floor, wherein the ceiling is opposite to the floor; a quartz vessel on the floor containing Ga metal; a mount installed on the ceiling on which a GaN substrate is mounted, the GaN substrate being opposite to the quartz vessel; a first gas supplying unit supplying the quartz vessel with hydrogen chloride (HCl) gas; a second gas supplying unit supplying the internal space of the reactor with ammonia ($NH_3$) gas; and a heating unit installed in conjunction with the wall of the reactor for heating the internal space, wherein the lower portion of the internal space is heated to a higher temperature than the upper portion.

19 Claims, 2 Drawing Sheets

APPARATUS FOR FABRICATION OF GAN BULK SINGLE CRYSTAL AND FABRICATION METHOD OF GAN SINGLE CRYSTAL INGOT USING THE SAME

CROSS-REFERENCE TO RELATED PATENT APPLICATION

This application claims the benefit of Korean Patent Application No. 10-2005-0007999, filed on Jan. 28, 2005, in the Korean Intellectual Property Office, the disclosure of which is incorporated herein in its entirety by reference.

BACKGROUND OF THE DISCLOSURE

1. Field of the Disclosure

The disclosure relates to an apparatus for fabrication of gallium nitride (GaN) bulk single crystal and a fabrication method of GaN single crystal ingot using the same; and, more particularly, to the apparatus for fabrication of GaN bulk single crystal which is capable of epitaxially growing GaN bulk single crystal by enhancing availability and deposition efficiency of GaN source gas, and to the fabrication method of GaN single crystal ingot using the same.

2. Description of the Related Art

Gallium nitride (GaN) as a wide bandgap semiconductor with a direct transition bandgap of which the bandgap energy is 3.39 eV, has been researched since beginning of the 1970s in order that it may be applied to a protection film and various optoelectronic devices such as a blue light emitting diode (LED) or the like. At room temperature, GaN crystal includes a plurality of unit cells with predetermined lattice constants of which "a" parameter and "c" parameter is 3.189 Å and 5.185 Å, respectively. Furthermore, since nitrogen has high electronegativity, GaN has a crystal structure of wurzite in a stable state and has a crystal structure of zinc-blende in a metastable state.

However, absence of a substrate material is still a major problem when developing an optical device using GaN. The best way to overcome this problem is to develop a GaN single crystal ingot, which is utilized as the substrate. But, since process conditions for growing the GaN single crystal ingot are very difficult, only GaN single crystal having a size of about 5 mm has been reported to date. In order to use a thick GaN film as the substrate, a research for fabricating a freestanding GaN substrate is being conducted. That is, according to this research, a sacrificial film such as zinc oxide (ZnO) is deposited on a different substrate such as sapphire, and then thick GaN film is grown on the sacrificial film. Thereafter, the sacrificial film is removed so that a desired thick GaN film may be obtained.

A hydrogen vapor phase epitaxial (HVPE) growing method is primarily utilized for growing the thick GaN film, because it has several advantages. That is, according to the HVPE growing method, epitaxial growth proceeds rapidly at a speed ranging from 50 μm/hr to 100 μm/hr and further, high purity epitaxial film can be grown during thin film growth. In addition, since fabrication of an apparatus is simpler than those required in other epitaxial growing methods, thick GaN film can be fabricated at a low manufacturing cost.

FIG. 1 is a flow chart illustrating a fabrication process of a GaN substrate using a prior art HVPE method.

In operation 2, a thick GaN film with a thickness ranging from 300 μm to 500 μm is grown on a sapphire substrate. Afterwards, in operation 4, a laser beam is irradiated on a GaN surface through the sapphire substrate using an excimer laser or an yttrium-aluminum-garnet (YAG) laser, to separate the thick GaN film from the sapphire substrate. Thereafter, in operation 6, the separated thick GaN film is processed to have a circular shape with a predetermined diameter and then, a hardfacing process is performed on a surface of the resultant thick GaN film. Finally, in operation 8, a damage layer remaining upon the surface of the thick GaN film which has been experienced through the hardfacing process is removed using a dry etching process.

U.S. Pat. No. 6,632,725 B2 discloses a crystal-growing method of a GaN epitaxial layer by means of the HVPE method. However, according to the HVPE method employing a chemical vapor deposition (CVD) technique of an open type, the amount of the GaN crystal grown on the sapphire substrate is exceedingly small with respect to total amount of GaN which is produced by reaction of GaCl and $NH_3$ gas so that manufacturing cost is increased.

Typically, the weight percent ratio of GaN crystal grown on the sapphire substrate with respect to the total GaN is not more than 5%. That is, most of GaN is attached on inner walls of a reactor or flows out with the exhaust, which causes a high manufacturing cost. Furthermore, when growing GaN on the sapphire substrate by the above HVPE method, it is shown that the defect density of GaN film within 1 μm thickness is beyond about $10^{10}/cm^2$ because of lattice constant inconformity between the sapphire substrate and the GaN film. On the contrary, when growing the GaN film up to a predetermined thickness more than 500 μm, defect density is decreased to about $10^6/cm^2$. Therefore, the GaN substrate obtained after crystal growth is deformed due to the defect density difference between a front face and a rear face. Generally, since the rear face shows a high defect density in comparison with the front face, the GaN substrate is bent downwardly. Such a deformation phenomenon of the GaN substrate may render it difficult to implement with respect to high-density integrated devices formed on a GaN substrate.

SUMMARY OF THE DISCLOSURE

The present invention may provide an apparatus for the fabrication of gallium nitride (GaN) bulk single crystal which is capable of epitaxially growing GaN bulk single crystal by enhancing the availability and deposition efficiency of GaN source gas, and a fabrication method of for GaN single crystal ingot.

According to an embodiment of the present invention, there may be provided an apparatus for fabricating a GaN (gallium nitride) single crystal, the apparatus including: a reactor having a ceiling, a floor and a wall with a predetermined height compassing an internal space between the ceiling and the floor, wherein the ceiling is opposite to the floor; a quartz vessel installed on the floor, in which a Ga metal is filled; a mount installed on the ceiling on which a GaN substrate is mounted, the GaN substrate being opposite to the quartz vessel; a first gas supplying unit supplying the quartz vessel with hydrogen chloride (HCl) gas; a second gas supplying unit supplying the internal space of the reactor with ammonia ($NH_3$) gas; and a heating unit installed on the wall of the reactor for heating the internal space, wherein a lower portion of the internal space is heated to a higher temperature than an upper portion.

According to another embodiment of the present invention, there may be provided a method for fabricating a GaN single crystal ingot, the method including: providing a reactor having a ceiling, a floor and a wall with a predetermined height encompassing an internal space between the ceiling and the floor, the ceiling being opposite to the floor; the mounting of heatsink material on the ceiling; the presence of a GaN substrate beneath the heatsink material; providing a lower portion of the internal space with GaN source gas, which corresponds to the GaN substrate; and epitaxially growing a GaN single crystal on the GaN substrate by supplying the GaN substrate with the GaN source gas by convection circulation induced by heating the lower portion of the internal space to a higher temperature than an upper portion.

Since GaN source gas such as GaCl and $NH_3$ gas is circulated in the closed reactor, it is possible to enhance the availability and deposition efficiency of the GaN source gas. In addition, since the GaN substrate having same lattice constant with GaN single crystal is employed as the seed to epitaxially grow GaN single crystal, it is possible to obtain GaN single crystal of good quality that has a defect density below $10^6$ defects/$cm^2$.

BRIEF DESCRIPTION OF THE DRAWINGS

The above and other features and advantages of the present invention are further illustrated in exemplary embodiments with reference to the attached drawings in which.

DETAILED DESCRIPTION OF THE INVENTION

An apparatus for fabricating a gallium nitride (GaN) single crystal and a method for fabricating a GaN single crystal ingot using the same will now be described with reference to the accompanying drawing, in which exemplary embodiments of the invention are shown.

Figure 1:
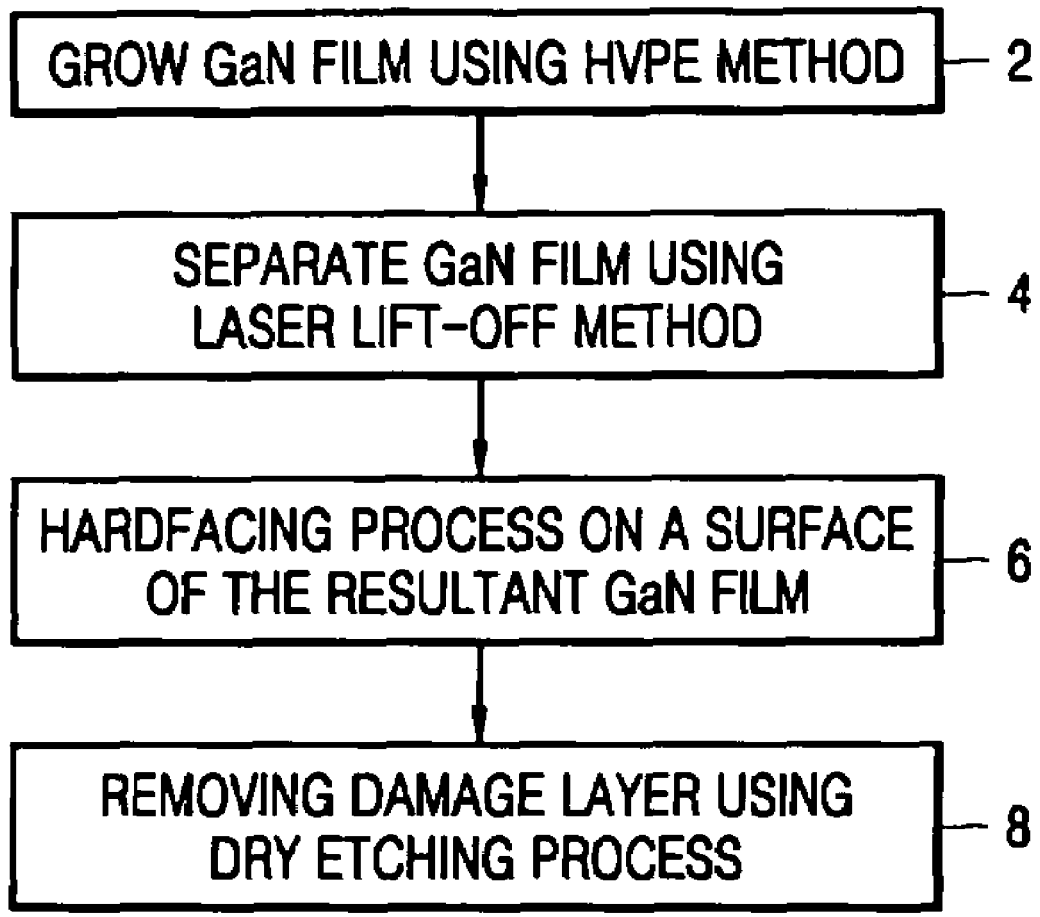
FIG. 1 is a flow chart showing a fabrication process of GaN substrate by means of a prior art HVPE method.
Figure 2:
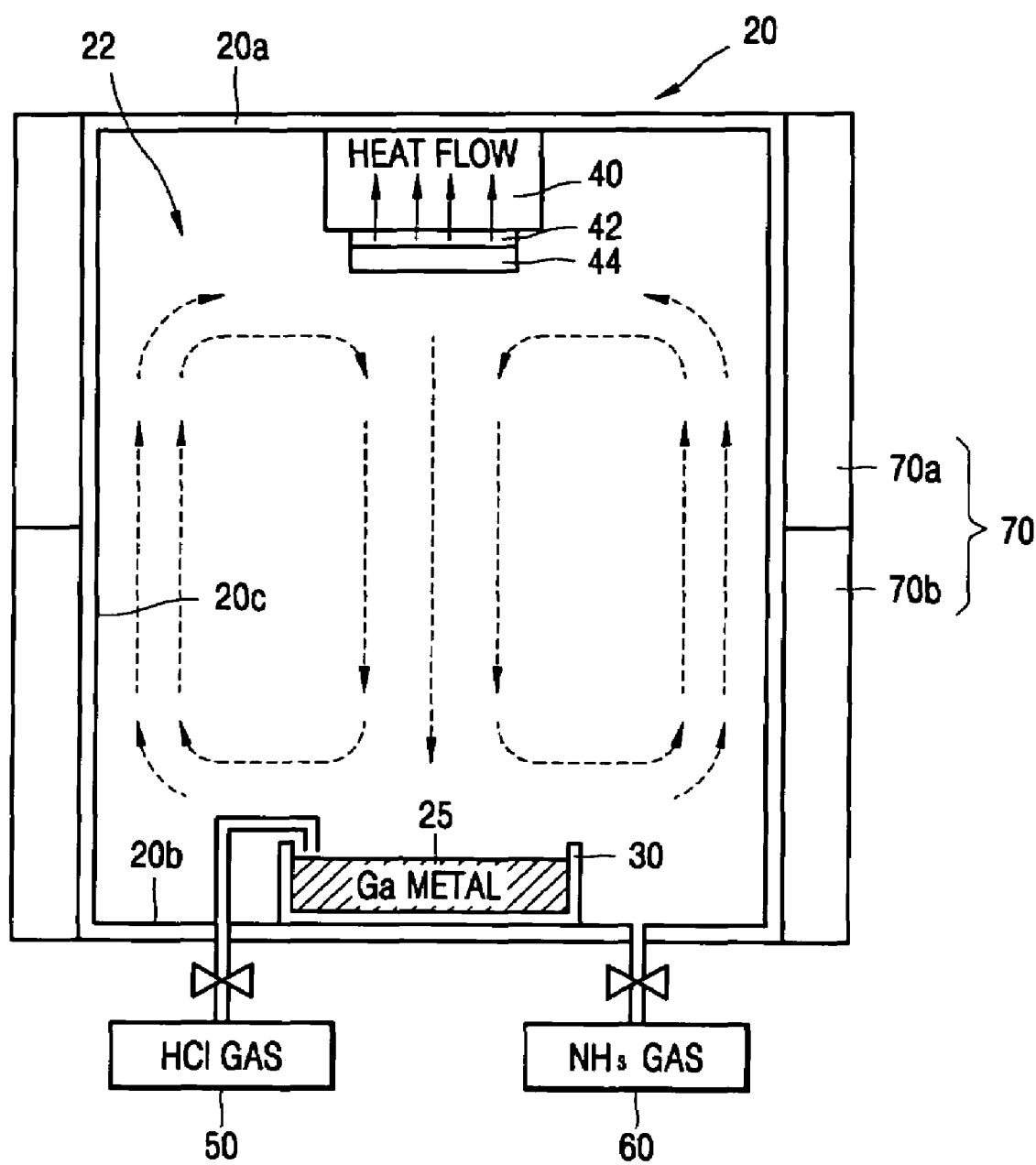
FIG. 2 is a schematic cross-sectional view illustrating an apparatus for fabricating a GaN bulk single crystal according to a preferred embodiment of the present invention.

FIG. 2 is a schematic cross-sectional view illustrating an apparatus for fabricating a GaN bulk single crystal according to a preferred embodiment of the present invention.

Referring to FIG. 2, the apparatus for fabricating the GaN bulk single crystal according to the present invention includes a reactor 20, a quartz vessel 30 installed in the reactor 20 in which Ga metal is filled, a mount 40 on which GaN substrate is mounted, a first gas supplying unit 50 for supplying the quartz vessel with hydrogen chloride (HCl) gas, a second gas supplying unit 60 for supplying the internal space 22 of the reactor 20 with ammonia ($NH_3$) gas, and a heater 70 for heating the internal space 22 of the reactor 20.

The reactor 20 is provided with a ceiling 20a, a floor 20b and a wall 20c with a predetermined height encompassing the internal space 22, wherein the ceiling 20a is opposite to the floor 20b. The quartz vessel 30 and the mount 40 are installed on the floor 20b and the ceiling 20a respectively so that the quartz vessel 30 is oppositely disposed with respect to the mount 40. Since the mount 40 is made of heatsink material which shows good heat conductivity, the mount 40 absorbs heat from the GaN substrate 42 mounted below.

The heater 70 is installed on the wall 20c and heats an upper portion and a lower portion of the internal space 22. In particular, the lower portion of the internal space 22 is heated to a temperature higher than that of the upper portion. Preferably, the heater 70 may be provided with an upper heater 70a and a lower heater 70b, in which heating temperature of the upper heater 70a ranges from about 300° C. to about 900° C. and that of the lower heater 70b ranges from about 500° C. to about 1,200° C.

Desirably, the first gas supplier 50 and the second gas supplier 60 may supply carrier gas respectively as well as its source gas, wherein the carrier gas is selected one from the group consisting of hydrogen, nitrogen, helium, argon gas port and a combination thereof. In addition, the reactor 20 may have a gas exhaust port (not shown) so that gas from within the reactor may be exhausted through the gas exhaust port so as to keep desired internal pressure in the reactor 20 when the internal pressure of the reactor 20 exceeds a predetermined air pressure range, i.e., about 1 atm to about 10 atm. The gas exhaust port preferably is positioned at a location within the wall which will not unduly interfere with the desired gas flow within the reactor.

In the apparatus for fabricating the GaN bulk single crystal, the lower portion of the internal space 22 is heated to higher temperatures in comparison with the upper portion, and further, the temperature at a region near to the wall 20c is higher than that of the central region of the internal space 22. In addition, since the mount 40 has good heat conductivity so as to absorb heat of the GaN substrate 42, the temperature of the internal space 22 is the lowest at the GaN substrate 42. Therefore, GaN source gas existing in the lower portion of the internal space 22 rises along the wall 20c and reaches the upper portion by means of heat convection. The GaN source gas that has risen up to the upper portion from the lower portion, thereafter is cooled when adjacent the GaN substrate 42, which causes the GaN source gas to descend from the upper portion to the lower portion. In FIG. 2, a circulation path of GaN source gas is depicted generally as dotted lines. During operation, the GaN substrate 42 is supplied by the circulation of GaN source gas so as to epitaxially grow the GaN single crystal on the GaN substrate 42.

When fabricating the GaN single crystal, as the GaN source gas circulates in the closed reactor 20 by convection, it is possible to increase availability and deposition efficiency of GaN source gas. In particular, the weight ratio of the GaN single crystal grown on the substrate compared to the total GaN produced by reaction of source gas in the reactor 20 is increased. That is, while this weight ratio according to the prior art apparatus is about 5%, the present invention improves this weight ratio up to about 20% or more. Accordingly, in comparison with the conventional HVPE method employing an open type reactor, the present invention can reduce the manufacturing cost for a GaN single crystal.

Hereafter, a method for fabricating a GaN single crystal using the aforementioned inventive apparatus according to the present invention will now be described in greater detail.

The apparatus for fabricating the GaN single crystal initially is provided. A GaN substrate 42 as a seed area is mounted beneath a mount 40 which is composed of heatsink material. Thereafter, GaN source gas is supplied to a lower portion of an internal space 22 corresponding to the GaN substrate 42. Herein, GaCl gas and $NH_3$ gas are used for the GaN source gas. More specifically, in order to obtain GaCl gas, Ga metal initially is provided. Then, HCl gas is supplied to the Ga metal so as to generate GaCl gas through chemical reaction. After preparing the source gas, the internal space 22 is heated. At this time, it is noted that the upper portion and the lower portion of the internal space 22 should be heated at different temperatures respectively so as to generate convection circulation of GaN source gas, which is generally depicted through the use of dotted lines in FIG. 2.

Preferably, the upper portion is heated at predetermined temperature ranging from about 300° C. to about 900° C. and the lower portion is heated at a predetermined temperature ranging from about 500° C. to 1,200° C. In addition, the internal pressure of the reactor 20 is maintained at a predetermined pressure ranging from about 1 atm to about 10 atm. The chemical reaction generated in the lower portion of the internal space 22 is presented by the following chemical formulae.

$$Ga + HCl \rightarrow GaCl + (\tfrac{1}{2})H_2 \quad \text{[Eq. 1]}$$

$$GaN + HCl \rightarrow GaCl + (\tfrac{1}{2})N_2 + (\tfrac{1}{2})H_2 \quad \text{[Eq. 2]}$$

Additionally, the chemical reaction generated in the upper portion of the internal space 22 is described as a following chemical formula.

$$GaCl + NH_3 \rightarrow GaN + HCl + H_2 \quad \text{[Eq. 3]}$$

As illustrated from the above chemical formulae, the GaN single crystal is epitaxially grown on the GaN substrate 42 in the upper portion, i.e., in a low temperature region through the above chemical reaction, whereas crystal growth of GaN is suppressed in the lower portion of the internal space 22, i.e., in a high temperature region. The reaction gas and the gas that is generated are circulated in reactor 20. Thereby, such circulation of gas is carried out so that the GaN single crystal is epitaxially grown and finally a GaN single crystal ingot 44 is obtained. Preferably, a carrier gas additionally is supplied into the internal space 22, wherein the carrier gas is selected one from the group consisting of hydrogen gas, nitrogen gas, helium gas, argon gas and a combination thereof.

Pursuant to the method for fabricating the GaN single crystal ingot 44 wherein GaN source gas such as GaCl gas and NH₃ gas are circulated in the closed reactor 20, it is possible to increase availability and deposition efficiency of GaN source gas that is supplied in the reactor 20. Since HCl gas is not a GaN source gas, HCl gas is recycled without consumption in the reactor 20. In addition, the method of the present invention is advantageous through the use of a GaN substrate instead of the conventional sapphire substrate. That is, since the GaN substrate is employed as the seed source in order to epitaxially grow the GaN single crystal, the substrate and GaN single crystal which is formed on the substrate have the same lattice constant so that defect density may be substantially reduced when compared to the conventional sapphire substrate. For instance, it is possible to obtain GaN single crystal that has a defect density below $10^6$ defects/cm². Furthermore, the GaN single crystal film obtained by the method displays a uniform defect density, low internal stress and enhanced thermal stability. Therefore, there is no bending phenomenon of the GaN substrate induced by high internal stress and poor thermal stability, which is one of the serious problems in the conventional method.

EXAMPLE

Heaters are mounted at predetermined locations to heat the upper portion and the lower portion of the internal reactor space differently. The lower portion of the internal space is heated to a higher temperature than the upper portion. Thereafter, Ga metal is positioned in a prepared vessel at the lower portion of the internal space and a GaN substrate is mounted beneath a mount of heatsink material which is disposed at the upper portion of the internal space. Thereafter, air in the reactor is removed using a vacuum apparatus. Subsequently, NH₃ gas is supplied into the reactor so that the internal pressure of the reactor achieves 2 atm to 5 atm. After the temperature of the lower portion is adjusted to 850° C. and that of the upper portion is adjusted to 600° C., HCl gas and NH₃ gas are supplied into the reactor so that GaCl source gas is generated in the lower portion of the internal space through chemical reaction of Ga metal and HCl gas, and thereafter, GaN is generated with HCl gas and H₂ gas by chemical reaction of GaCl gas and NH₃ gas in the upper portion.

In the reactor, the higher-temperature region resides at the lower portion of the internal space and an outer region close to the wall of the reactor is heated to a higher temperature than the central region of the internal space. The temperature at a region where the GaN substrate is mounted is lowest within the reactor. Gas of higher temperature rises to the upper portion of the internal space along the wall and gas of a lower temperature descends along the central region of the internal space via convection. By virtue of the heat convection, Ga metal in the lower portion reacts with HCl gas descended from the upper portion so that GaCl gas is generated in the lower portion of the internal space. Simultaneously, the NH₃ gas that is consumed is supplied from an exterior supplier during the circulation, whereas HCl gas is hardly consumed because it is not GaN source gas. Through the repeated convection circulation of gas, the GaN seed is grown continuously until raw material in the lower portion of the internal space is completely consumed to obtain GaN bulk single crystal. In general, it commonly takes about 10 days in order to grow GaN single crystal 10 mm thick. After completing growth of the GaN single crystal, the valve of the gas supplier is shut off; the internal space is cooled and atmospheric pressure is achieved; the cover of the reactor is removed; and completed GaN single crystal and any residual raw material are retrieved.

According to the present invention, wherein GaN source gas such as GaCl gas and NH₃ gas are circulated in a closed reactor, it is possible to increase the availability and deposition efficiency of the GaN source gas.

In particular, since HCl gas is not GaN source gas, HCl gas is not consumed and recycled in the reactor. In addition, the weight ratio of GaN single crystal grown on the substrate with respect to the total GaN produced in the reactor 20 is increased. That is, while this weight ratio according to the prior art apparatus is about 5%, the present invention improves this weight ratio up to about 20%, or more. Accordingly, in comparison with the conventional HVPE method employing an open-type reactor, the present invention can reduce the manufacturing cost for the GaN single crystal.

In addition, the method of the present invention is advantageous by utilizing the GaN substrate instead of a conventional sapphire substrate. That is, since the GaN substrate is employed as the seed to epitaxially grow GaN single crystal, the substrate and GaN single crystal which will be formed on the substrate have the same lattice constant so that the defect density may be substantially reduced when compared to the conventional sapphire substrate. For instance, it is possible to obtain GaN single crystal that has defect density below $10^6$ defects/cm². Furthermore, the GaN single crystal film obtained by the inventive method shows uniform defect density, low internal stress and enhanced thermal stability. Therefore, there is no bending phenomenon of the GaN substrate incurred by high internal stress and poor thermal stability, which is one of serious shortcomings of the conventional method.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for fabricating a GaN single crystal ingot, the method comprising:

providing a reactor including a ceiling, a floor and a wall having a predetermined height encompassing an internal space between the ceiling and the floor, the ceiling being opposite to the floor;

installing a mount of heatsink material on the ceiling;

mounting a GaN substrate beneath the mount;

providing a lower portion of the internal space with a GaN source gas which corresponds to the GaN substrate; and epitaxially growing a GaN single crystal on the GaN substrate by supplying the GaN substrate with the GaN source gas in virtue of convection circulation induced by heating the lower portion of the internal space higher than an upper portion.

2. The method of claim 1, wherein the heating temperature of the upper portion ranges from 300° C. to 900° C. and the heating temperature of the lower portion ranges from 500° C. to 1,200° C., wherein the convection circulation from the temperature gradient between the lower portion and the upper portion provides deposition of the GaN from the GaN source gas on to the GaN substrate to fabricate the GaN single crystal ingot.

3. The method of claim 1, wherein an internal pressure of the reactor is maintained in a range of about 1 atm to about 10 atm.

4. The method of claim 1, wherein the providing of the GaN source gas includes:

providing GaCl gas; and $NH_3$ gas.

5. The method of claim 4, wherein the providing of said GaCl gas includes:

providing Ga metal; and generating said GaCl gas by reacting the Ga metal with HCl gas.

6. The method of claim 1, wherein carrier gas is further supplied into the internal space.

7. The method of claim 6, wherein the carrier gas is selected from the group consisting of hydrogen, nitrogen, helium, argon and combinations thereof.

8. The method of claim 1, wherein the reactor is a closed reactor, and wherein the method further comprises recycling HCl within the closed reactor.

9. The method of claim 1, wherein the reactor is a closed reactor, and wherein the method further comprises circulating GaCl gas and $NH_3$ gas within the closed reactor.

10. The method of claim 1, wherein the internal pressure of the internal space in the reactor has a pressure of greater than 1 atm.

11. The method of claim 10, wherein the internal pressure of the reactor is maintained in a range of about 2 atm to about 5 atm.

12. The method of claim 1, wherein the heating temperature of the lower portion is at least 200° C. hotter than the heating temperature of the upper portion.

13. The method of claim 12, wherein the heating temperature of the lower portion is around 850° C. and the temperature of the upper is around 600° C.

14. A method for fabricating a GaN single crystal ingot, the method comprising:

providing a reactor with an upper portion and a lower portion enclosing an internal space;

providing a GaN substrate within the reactor;

heating the reactor such that the lower portion is hotter than the upper portion;

supplying $NH_3$ gas to an internal pressure of about 2 atm to about 5 atm;

supplying HCl gas and reacting HCl gas with a Ga metal source to generate GaCl gas; and generating GaN by circulating GaCl gas and $NH_3$ gas in the internal space while the reactor is closed.

15. The method of claim 14, wherein the method further comprises recycling HCl within the closed reactor.

16. The method of claim 14, wherein the heating temperature of the lower portion is hotter than the upper portion.

17. The method of claim 16, wherein the heating temperature of the lower portion is at least 200° C. hotter than the heating temperature of the upper portion.

18. The method of claim 17, wherein the heating temperature of the lower portion is around 850° C. and the temperature of the upper is around 600° C.

19. The method of claim 16, wherein the heating temperature of the lower portion being hotter than the upper portion causes convection circulation from the temperature gradient between the lower portion and the upper portion, and wherein the convection circulation provides deposition of the GaN from the GaN source gas on to the GaN substrate to fabricate the GaN single crystal ingot.

* * * * *